United States Patent [19]

Miyauchi et al.

[11] Patent Number: 4,463,073
[45] Date of Patent: Jul. 31, 1984

[54] METHOD AND APPARATUS FOR REDRESSING DEFECTIVE PHOTOMASK

[75] Inventors: Tateoki Miyauchi; Katsuro Mizukoshi; Mikio Hongo; Masao Mitani, all of Yokohama; Masaaki Okunaka, Fujisawa; Takao Kawanabe, Mitaka; Isao Tanabe, Higashiyamato, all of Japan

[73] Assignee: Hitachi, Ltd., Tokyo, Japan

[21] Appl. No.: 394,642

[22] Filed: Jul. 1, 1982

[30] Foreign Application Priority Data

Jul. 3, 1981 [JP] Japan ................... 56-103357

[51] Int. Cl.$^3$ .............................................. G03F 9/00
[52] U.S. Cl. ........................................ 430/5; 430/330; 430/331; 430/938; 430/945; 427/53.1; 427/142
[58] Field of Search ............... 430/5, 331, 938, 945, 430/330; 427/10, 53.1, 142

[56] References Cited

U.S. PATENT DOCUMENTS 4,190,759  2/1980  Hongo et al. ............ 219/121 LM
4,200,668  4/1980  Segal et al. ............. 427/53.1
4,340,654  7/1982  Campi .................... 430/5

FOREIGN PATENT DOCUMENTS 56-30722  3/1981  Japan .

Primary Examiner—John E. Kittle
Assistant Examiner—José G. Dees
Attorney, Agent, or Firm—Antonelli, Terry & Wands

[57] ABSTRACT

A method and apparatus for repairing defect portions of a photomask. A complex material from which a light shading material can be deposited is applied over the photomask. A white (blank) defect region is irradiated with a continuous wave laser light beam projected in a slit-like light image to thereby convert the complex material into the shading material. After washing, a half-deposited portion formed in a peripheral portion of the light shading region is further deposited by a post-baking process. Those portions of the light shading film which depart from the desired mask pattern are removed together with black (solid) defect portion originally present in the photomask through irradiation with a pulse laser light beam. The pulse laser is constituted by a Dye-laser, while the continuous wave laser is constituted by an Ar-laser. A specific half-mirror which transmits therethrough Ar-laser light while reflecting Dye-laser light is displaceable provided. The white and the black defects are selectively centered on a same optical axis of an optical projection system including a slit and a condenser lens, whereby the white and the black defect portions are each removed through irradiation with the associated laser light projected thereto in a slit-like light image through the same optical projection system.

16 Claims, 19 Drawing Figures

PRIOR ART

METHOD AND APPARATUS FOR REDRESSING DEFECTIVE PHOTOMASK

The present invention relates to a method of remedying pattern defects in photomasks and an apparatus for carrying out the method.

In fabrication of an LSI (Large Scale Integrated) circuit, several sheets of photomasks each having a pattern of circuit or the like depicted thereon are sequentially transferred onto a wafer to thereby make up a fine circuit. Accordingly, a defect present in the pattern of the photomask will inevitably transferred, as it is, onto a chip of the LSI, providing a cause for failures and lowering the yield of products. Many attempts have heretofore been made to remedy or rectify the defects of the photomask.

An example of the mask defect rectification according to the hitherto known method is illustrated in FIG. 1 of the accompanying drawings. Referring to this figure, a normal pattern 5 made of chromium is deposited on a glass substrate in thickness of several hundred angstroms (Å). In addition to this normal pattern, there are shown a spot-like solid defect 6 formed by an extra residue of the pattern material (this defect is referred to as black defect) and blank defects 7 ascribable to partial absence or delamination of the mask material (this sort of defect is referred to as white defect). The black defect 6 is usually eliminated by irradiating it with a laser beam 2 emitted by a laser oscillator 1 and focussed through a condenser lens 3. This method can not however be applied to the remedy of the white defect 7.

FIGS. 2A to 2E of the accompanying drawings illustrate one of the hitherto known methods of remedying the white defect. It is assumed that the white defect 7 exists as brought about by partial falling-off or delamination of a pattern 5 of chromium (Cr) deposited on a glass substrate, as shown in FIG. 2A. For remedy of such white defect 7, a positive photoresist layer 9 is applied over the pattern 5, as shown in FIG. 2B. Subsequently, the region of the photoresist layer 9 corresponding to the white defect 7 is irradiated with a spot light beam. After development process, the photoresist material overlying the white defect 7 exposed to the light is removed away, while the other unexposed portion of the photoresist layer 9 remains unremoved and serves as a mask. Refer to FIG. 2C. Next, a Cr-film 10 is formed over the whole surface through sputtering evaporation, whereby the Cr-film 10 is directly deposited on the glass substrate 4 at the region corresponding to the white defect 7, while the Cr-film 10 is deposited on the photoresist layer 9 at the other region. At the final step, the photoresist layer 9 is removed. Then, the evaporated Cr-film portion deposited directly on the glass film remains as a remedied Cr-portion 11, as shown in FIG. 2E. Of course, all the other Cr-film portion formed through the evaporation process is removed away together with the photoresist material. Now, the white defect has been rectified.

It will be understood that the white defect remedy method described above requires a large number of steps, including the application of photoresist, pre-baking, irradiation with a spot light beam, development, sputtering evaporation under vacuum, removal of the photoresist and washing, each requiring a relatively long time. Under the circumstance, there has existed a great demand for the defect remedying method which can be realized with a decreased number of the processing steps which are also reduced with respect to the time taken in carrying out the steps.

Accordingly, an object of the present invention is to provide a method of remedying or rectifying both the black defect and the white defect, which method does not suffer the drawbacks of the prior art described above and which can be realized with a significantly decreased number of processing steps each capable of being accomplished within a relatively short time in a facilitated manner. Another object of the invention is to provide an apparatus for carrying out the above method.

In view of the above and other objects which will be made more apparent as description proceeds, there is proposed according to a general aspect of the invention a defect remedying method according to which a complex material from which a substance exhibiting a light shading property can be deposited is applied over a photomask to be mended. Regions of the complex material layer corresponding to the white defects are selectively irradiated or illuminated with a laser light beam to thereby form the light shading film through deposition. After washing, a half or partially deposited portion formed in a peripheral region of the light shading film portion is completely deposited. Subsequently, those deposited portions which are offset from a normal desired pattern as well as the intrinsic black defects, if present, are removed away by irradiating them with a pulse laser beam. According to another aspect of the present invention, there is proposed a photomask redressing or rectifying apparatus which comprises a single work head provided with a high power pulse laser oscillator and a continuous wave (CW) laser oscillator, which are so disposed that optical axes of the respective laser beams coincide with an optical axis of a projecting system including a slit and a condenser lens so that the projecting system may be used in common to both of the laser oscillators mentioned above. With this arrangement of the apparatus, both the black defect and the white defect can be arbitrarily and selectively remedied by using one and the same work head by correspondingly selecting the laser oscillator to be activated.

The above and other objects, novel features and advantages of the invention will be more clearly understood by reading the description of preferred embodiments of the invention made in conjunction with the accompanying drawings, in which.

Figure 1:
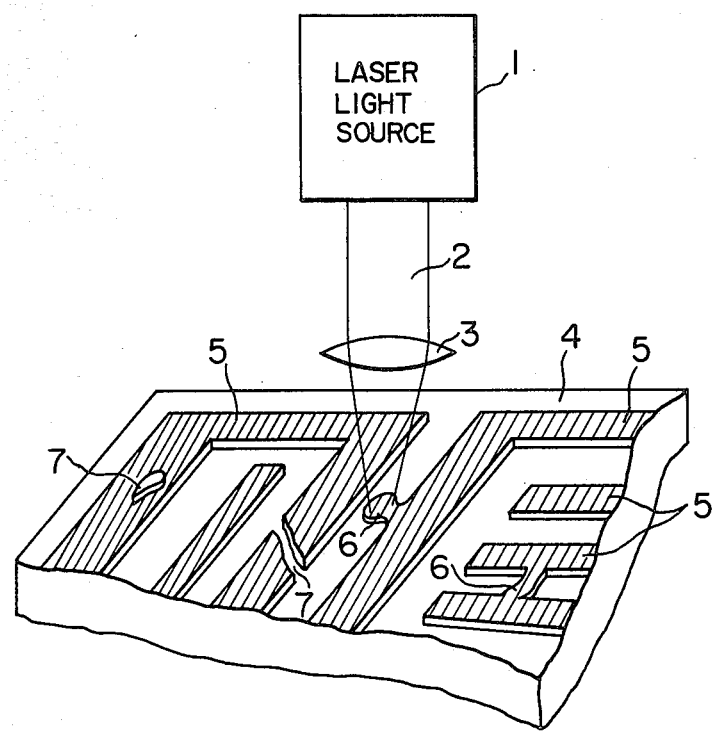
FIG. 1 is a view to illustrate an example of the hitherto known method of remedying the black defect.
Figure 2A:
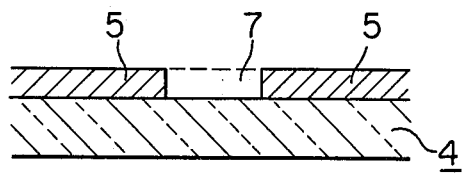
FIGS. 2A to 2E illustrate a hitherto known process for remedying or rectifying the white defect.
Figure 2B:
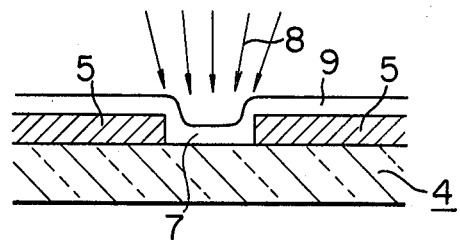
Figure 2C:
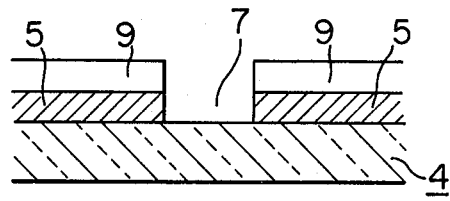
Figure 2D:
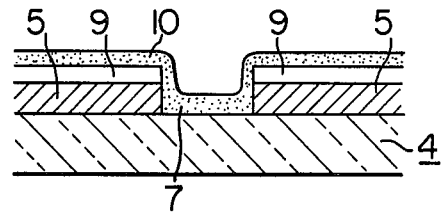
Figure 2E:
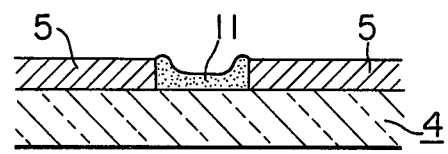
Figure 3:
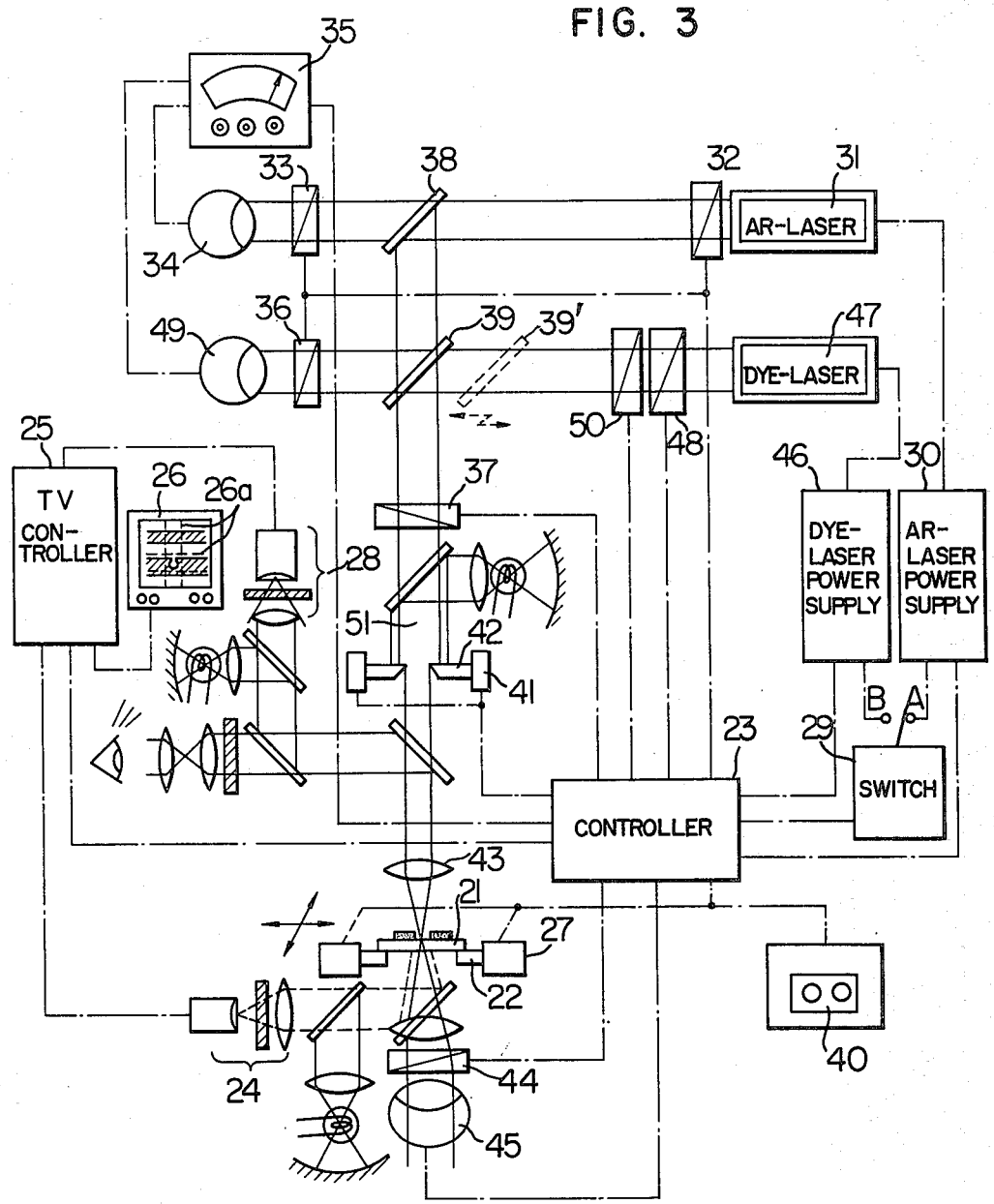
FIG. 3 is a view showing schematically a general arrangement of a photomask redressing apparatus according to an embodiment of the invention which apparatus is capable of remedying both the white defect and the black defect.
Figure 4:
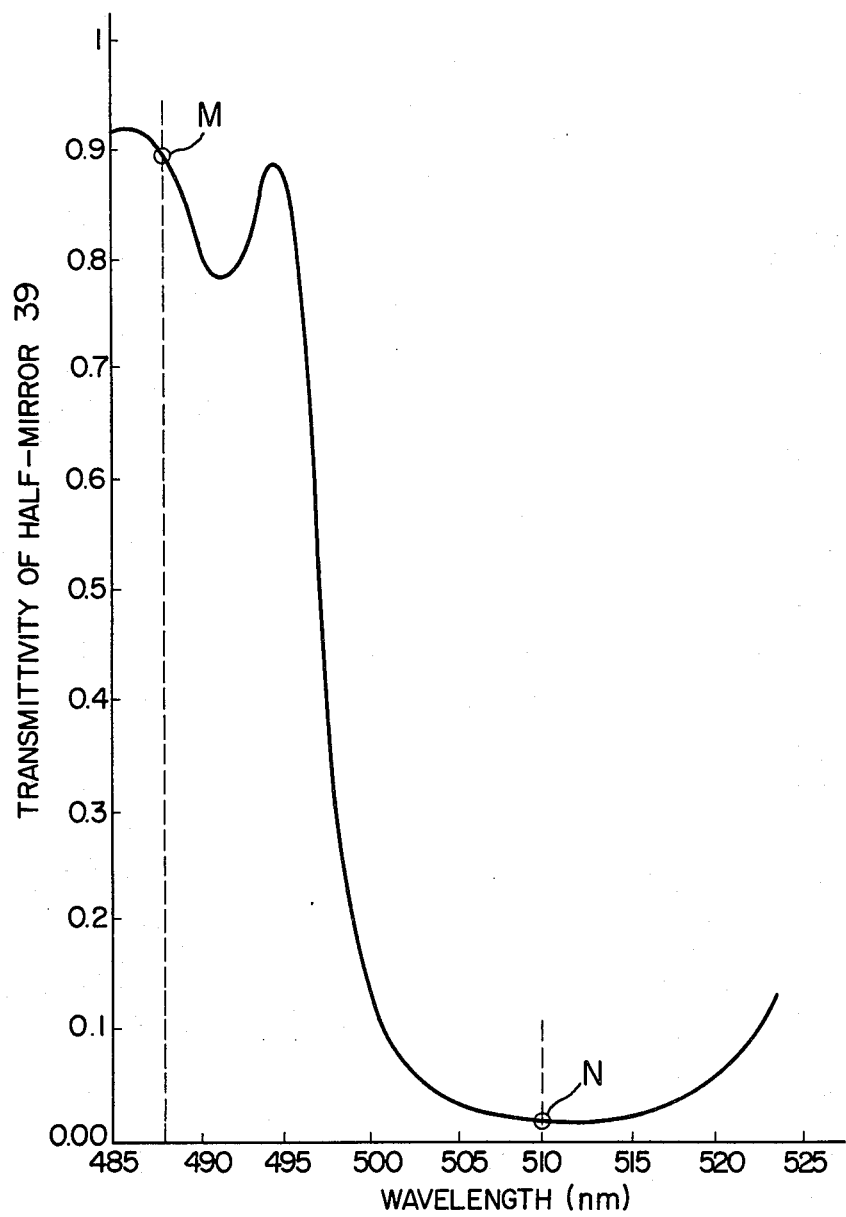
Figure 5:
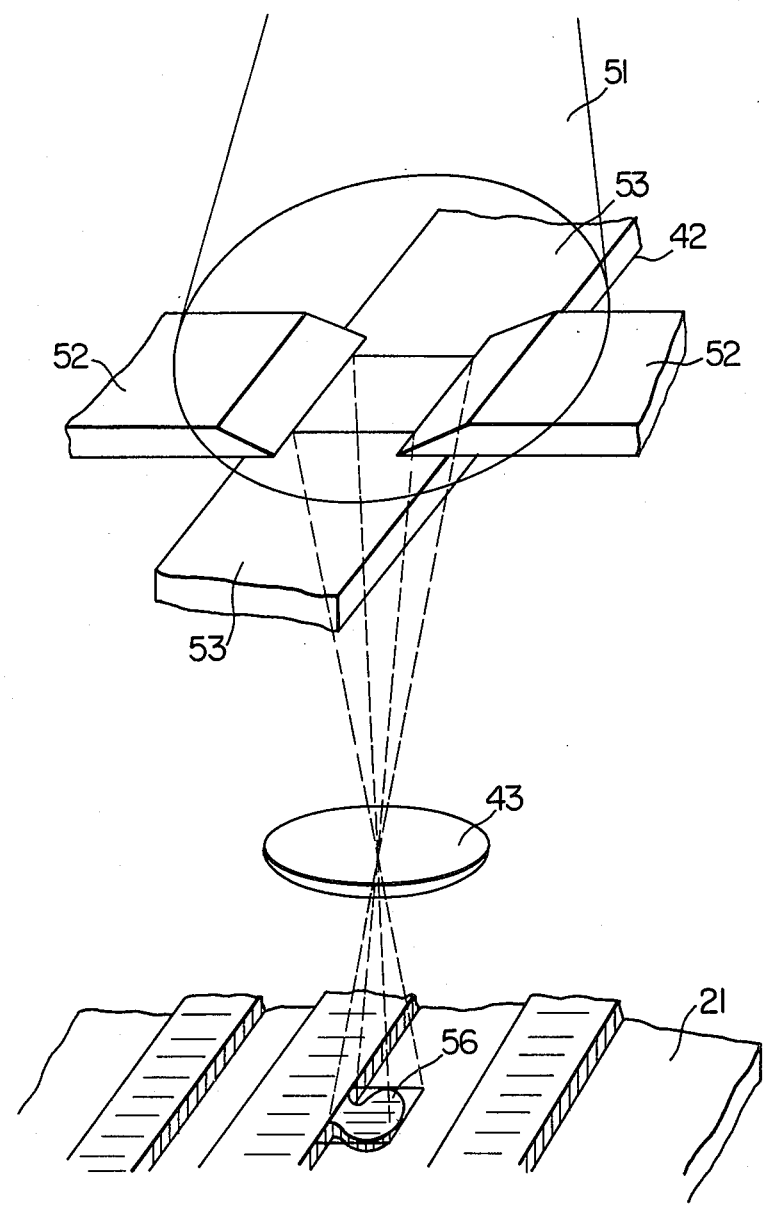
Figure 6:
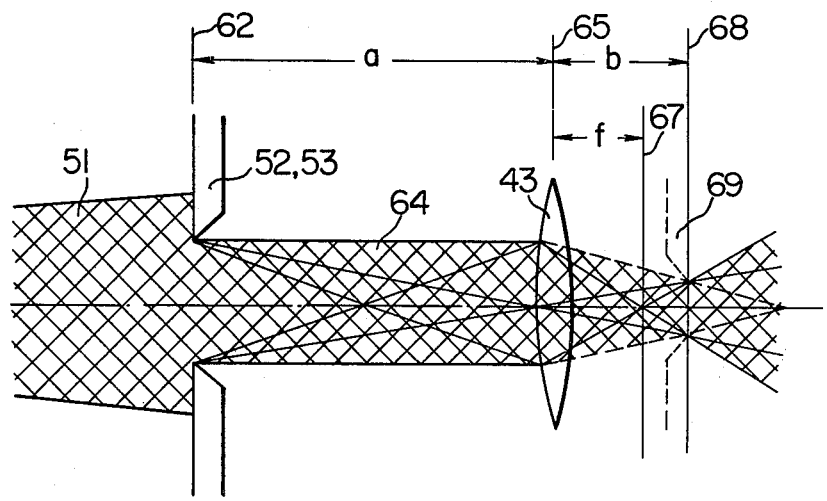
Figure 7A:
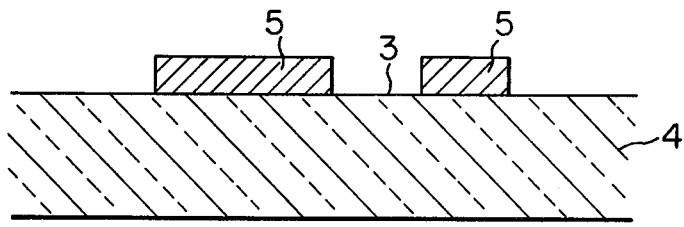
Figure 7B:
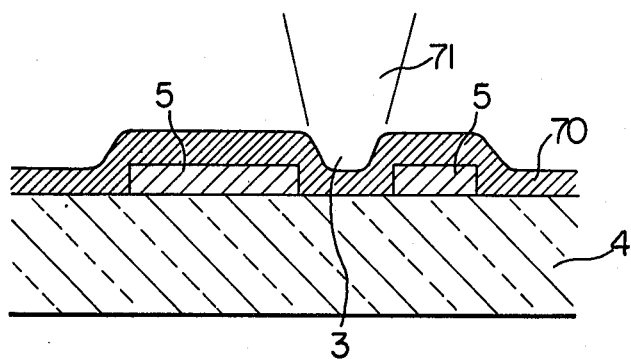
Figure 7C:
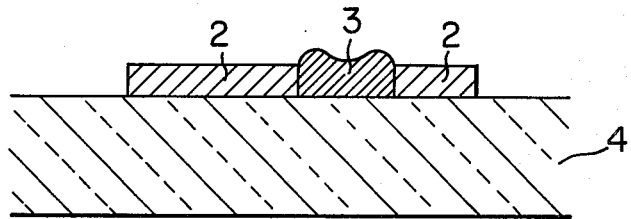
Figure 8A:
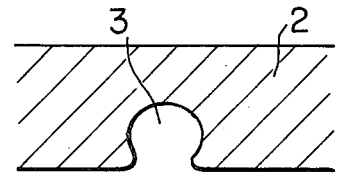
Figure 8B:
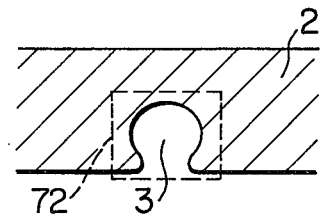
Figure 8C:
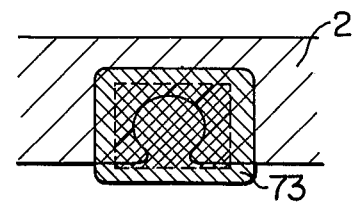
Figure 8D:
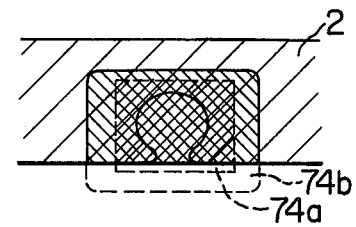
Figure 9:
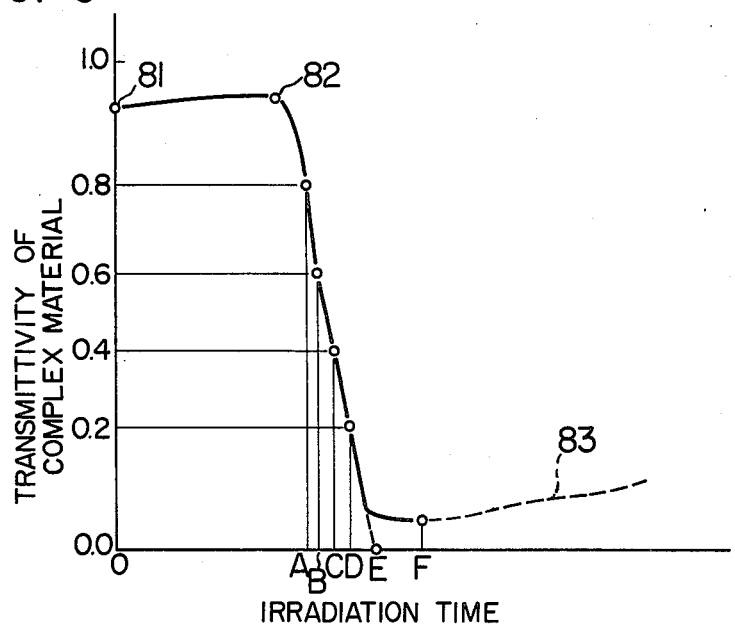
Figure 10:
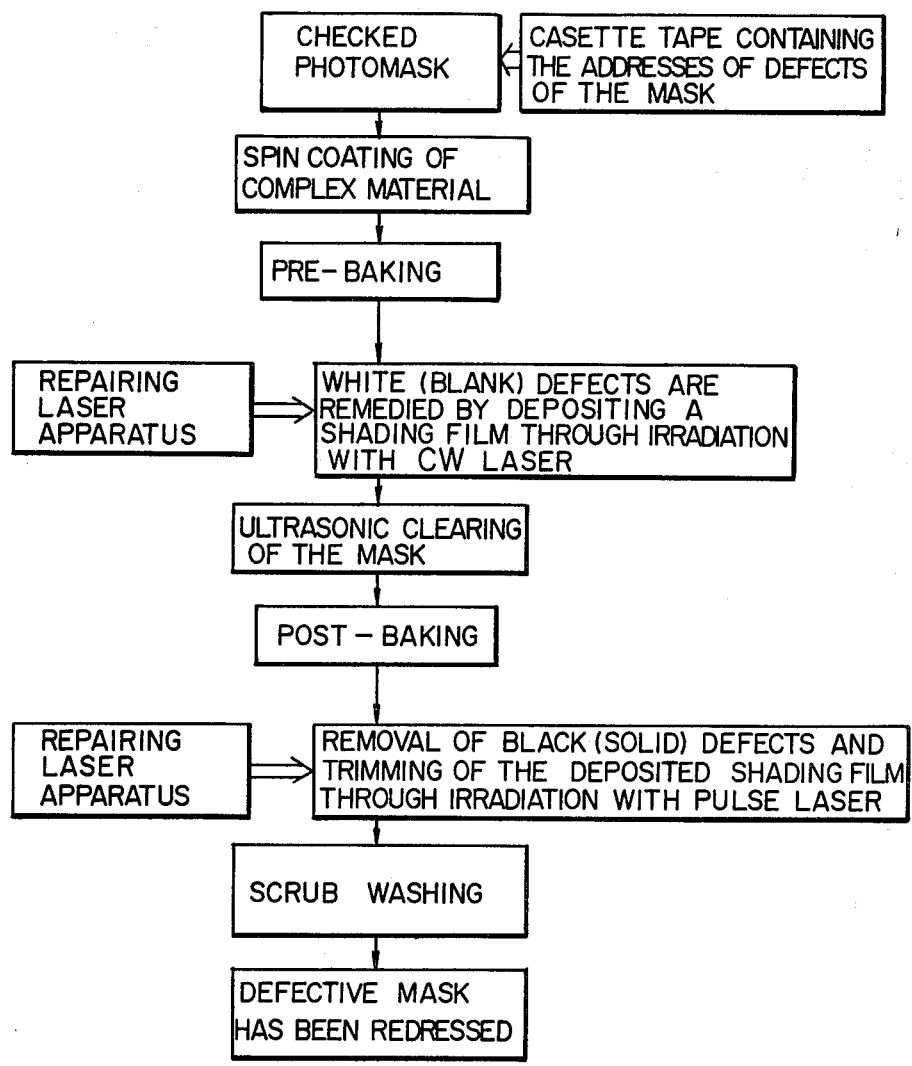

FIG. 4 graphically illustrates a transmittivity characteristic of a special half mirror employed in the apparatus shown in FIG. 3;

FIG. 5 is a pictorial view illustrating the principle of an optical projecting system according to an embodiment of the invention;

FIG. 6 is a view to illustrate imaging or focussing operation of the optical projecting system shown in FIG. 5;

FIGS. 7A to 7C are views illustrating a process for remedying a white defect according to the teaching of the invention;

FIGS. 8A to 8D are top plan views illustrating the white defect remedying process corresponding to that shown in FIGS. 7A to 7C;

FIG. 9 is a view to illustrate a manner in which a transmittivity monitor and laser irradiation are stopped for rectification of the white defect according to the teaching of the invention; and FIG. 10 shows in summarization essential steps included in a photomask repairing or redressing method according to the invention.

Now, the invention will be described in detail in conjunction with the preferred embodiments thereof by referring to the accompanying drawings.

Referring to FIG. 3 showing a general arrangement of a photomask repairing or redressing apparatus according to an exemplary embodiment of the invention, the apparatus is manipulated and operated in a manner mentioned below. First, a photomask 21 suffering the black and the white defects such as described hereinbefore is disposed on a supporting stage 22. Subsequently, an alignment mode and a low magnification observation mode are selected by means of a controller 23. Then, the image of the photomask picked up by an imaging system 24 of low magnification is transmitted to a television or TV monitor by way of a television (TV) controller 25 for observation or monitoring. When the stage or table 22 is to be displaced by means of the controller 23, a table drive system 27 is operated to displace the mask 21 to the left or right, whereby the image of the mask pattern visible on the screen of the TV monitor 26 is correspondinlgy displaced. In this connection, it is to be noted that there are displayed on the screen of the TV monitor 26 two pairs of reference lines 26a in both horizontal and vertical directions, respectively, which lines can be moved freely with the aid of the controller 23. Adjustment is made such that the pattern of the photomask is substantially aligned with respect to these reference lines. Next, the low magnification imaging system 24 is changed over to an imaging system 28 of large magnification, and the alignment or positioning of the photomask pattern is effected with a higher precision.

Upon completion of the positioning or alignment operation, the controller 23 is changed over to the white defect remedy mode. At that time, a power change-over switch 29 is changed over to a switch position A to thereby validate a power source 30 for an Ar-laser 31. At the same time, a predetermined continuous wave light output is produced from the Ar-laser with an Ar-laser shutter 32 and an Ar-laser monitor shutter 33 being opened. A part of the Ar-laser light energy impinges on an optoelectrical transducer or light receiver 34 provided in association with the Ar-laser 31. The output of the light receiver 34 is measured by means of a power meter 35 whose output signal is fed back to the controller 23. When the output signal is deviated from a predetermined output level, a signal is transmitted to the Ar-laser power source 30 to control the discharge current thereof so that the predetermined output level is regained. At that time, a monitor shutter 36 for a Dye-laser 47 and a shutter 37 located in a white defect remedying optical path are in the closed state. The Ar-laser light is reflected by a total reflection mirror 38 reflecting about 99% of the incident light and directed to a special half-mirror 39 which exhibits such a transmission characteristic that a major part of the Ar-laser light having wavelength of 488 nm is transmitted therethrough, while a major part of the Dye-laser light having wavelength of 510 nm is reflected. The Ar-laser light transmitted through the special half-mirror 39 reaches at the shutter 37 for the white defect rectification which is now in the closed state.

When operator pushes a white defect centering button provided on the controller 23, the table drive unit 27 is operated in accordance with information read out from a cassette tape 40 which stores therein defect address information, as the result of which the white defect portion to be first remedied makes appearance on the TV monitor 26. Then, the operator adjusts the positions of the four reference lines 26a by means of the controller 26 so that the white defect displayed on the TV monitor is enclosed by these four lines 26a, which in turn results in that a slit drive unit 41 is actuated in such a manner that the image of a slit 42 is automatically so projected by an objective lens 43 as to cover the white defect of the photomask 21.

After the adjustments described above, the operator can now push an irradiation button provided on the controller 23 to thereby open the shutter 37 for the white defect rectification and the shutter 44 for measuring the transmitted light. The laser light passed through the slit 42 is projected onto the white defect portion as a reduced projection image of the slit 42, being focussed by the objective lens 43. The white surface of the photomask is coated with a metallic complex material in thickness of ca. 0.2 to 2 $\mu$m, which complex, intrinsically transparent, is caused to exhibit a light shading property (opaqueness) upon exposure to the irradiation of laser light. To this end, such a complex material may be used which contains silver nitrate, citraconic acid, acetonitrile, methyl cellosolve, titanium alcoholate, acetylaceton and a solvent of a light boiling point such as triethylene glycol monomethyl ether. The addition of the solvent exhibiting a high boiling point to the composition of the metallic complex is to prevent cracks from being produced in the applied coat film during a pre-baking process.

The metallic complex as has been described in this embodiment is the metallic complex in a narrow meaning, that is, it is a concept including metallic salts created in the general reaction of solution, in addition to an atom group made up of one or more metallic atoms as the center atom and another atom or atoms, i.e. ligand, linking to the center atom to form an atom group.

According to one embodiment of the present invention, a solution made of an organic solvent added by silver nitrate, a carboxylic acid and an additive is used as a metallic complex. In this case, a solute carboxylic acid silver salt is produced in the solution. The reason why a carboxylic acid silver salt among many silver salts is preferably used is that it easily melts in the organic solvent and it forms a satisfactory film even if the organic solvent is vaporized.

There are various kinds of carboxylic acids usable to produce a carboxylic acid silver salt. Those showing satisfactory filming characteristics in practical application processes are: dicarboxylic acids having two carboxyl groups (—COOH) such as for example, oxalic acid, malonic acid, succinic acid, glutaric acid, adipic acid, pimelic acid, suberic acid, azelaic acid, sebacic acid, fumaric acid, maleic acid, and citraconic acid. Among those, citraconic acid is particularly satisfactory for making a film.

Besides the dicarboxylic acid,s a carboxylic acid having satisfacory filming property in practical process is a hydroxy acid with a carboxyl group (—COOH) and the alcoholic hydroxyl group (—OH). Some examples of such carboxylic acids are: lactic acid, malic acid, citric acid, tartaric acid, tartonic acid, hydroxyacrylic acid, glycolic acid, glyceric acid, β-hydroxypropionic acid, α-hydroxy-n-butyric acid, α-hydroxyisobutyric acid.

Some examples of the organic solvent are: the organic solvents of alcohol type, cellosolve type, carbitol type, glycol type, dimethylsulfoxide, dimethylacetamide and dimethylformamide. Among those, the best solvent is a mixture of methyl cellosolve and acetonitrile.

In addition, the contact between the deposited metallic film, metal oxide film or a composition thereof and the substrate can be enhanced by addition of a titanium alcoholate. Particularly, titanium tetrabutylate is the best.

A complex film having a thickness of 0.1–1 μm is formed with the foregoing solution used as an application liquid. The metallic film and the titanium oxide film deposited in the foregoing method have a large bonding strength to the substrate, and they have a transmittivity of 2–10% for the wavelength of 3500 Å to 5000 Å.

In this embodiment, an Ar laser oscillator is used for the laser beam source. The wavelength of 5145 Å or 4880 Å or both of them are used. However, it is not limited to these wavelengths, but ultraviolet rays of the Ar laser, the fundamental wave and its harmonic waves of the YAG laser can be used satisfactorily for this purpose.

After depositing the metallic film, metal oxide film or composition thereof, the photomask is washed by methyl cellosolve or acetonitrile or a mixture thereof, and the complex film other than the deposited portion can be removed completely.

If it is required to enhance the bonding strength of the contact between the deposited silver film and the substrate, it is fulfilled by addition of titanium alcoholate to the silver complex solution. The silver complex solution for correcting the transparent defects of the photomask can preferably be prepared from the following ingredients:

| silver nitrate | 1.0 mmole | (170 mg) |
| citraconic acid | 0.5–5 mmoles | (65–650 mg) |
| titanium alcoholate (tetrabutoxy titanium decamer) | 0.5–5 mmoles | (110–1100 mg) |
| total organic solvents | 2.3–48 mmoles | (144–3062 mg) |
| (1) Acetylaceton | 0.2–5 mmoles | (20–500 mg) |
| (2) acetonitrile | 1.0–20 mmoles | (41–820 mg) |
| (3) methyl cellosolve | 1.0–20 mmoles | (76–1520 mg) |
| (4) dimethylsulfoxide | 0.1–3 mmoles | (7–222 mg) |

When a silver complex solution prepared by the above-mentioned formulation is used as the application liquid, and the bonding strength between the silver-titanium oxide film deposited in the foregoing method and the substrate is enhanced considerably. The transmittivity of the silver-titanium oxide film deposited in this manner ranges from 2 to 10% for visible rays having a wavelength of 3500–5000 Å. Other kinds of titanium alcoholates usable for this purpose are:

$Ti(O-iso-C_3H_7)_4$, $Ti[OCH_2CH(C_2H_5)C_4H_9]_4$, $Ti(O-C_{17}H_{35})_4$, $Ti(O-iso-C_3H_7)_2[OC(CH_3)CHCOCH_3]_2$, $Ti(O-n-C_4H_9)_2[OC_2H_4N(C_2H_4OH)_2]_2$, $Ti(OCH_2CH(C_2H_5)CH(OH)C_3H_7]_4$, $Ti(O-n-C_4H_9)_3(OCOC_{17}H_{35})$

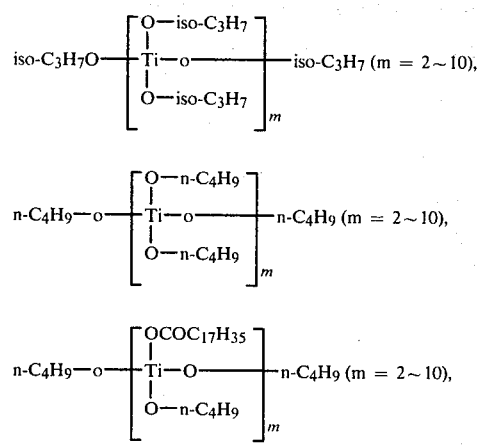

$Ti(iso-C_3H_7)(OCOC_{17}H_{35})_3$, $Ti(iso-C_3H_7)[OCOC(CH_3)=CH_2]_2(OCOC_{17}H_{35})$, $Ti(O-iso-C_3H_7)(OCOCH-CH_2)_3$ For the metallic complex solution used in the present invention other than the above-mentioned silver complex solution, a cobalt complex solution or a copper complex solution can be used. Here, the cobalt complex solution is a solution made of an organic solvent added by cobalt nitrate $(Co(NO_3)_2.nH_2O)$ and carboxylic acid, and the copper complex solution is a solution made of an organic solvent added by copper nitrate $(Cu(NO_3)_2.nH_2O)$ and carboxylic acid. The organic solvent and carboxylic acid are the same as used in the silver complex solution.

In the case of the silver complex solution, silver is deposited. However, in the cases of the cobalt complex solution and the copper complex solution, metals are deposited as a black oxide. The cobalt oxide has a transmittivity of 2–4% and the copper oxide 3–9% for visible rays with a wavelength of 4000–5000 Å, and these values of transmittivity are good enough for practical use. In this case, however, the cobalt and copper chelates need to be added with the surface active agent in order to improve the filming characteristics. A nonionic surface active agent is particularly suited for this purpose. Some examples of the nonionic surface active agent are: polyethylene glycol alkyl ethers $R(OCH_2CH_2)nOH$, polyethylene glycol fatty acid esters $RCO(OCH_2CH_2)nOH$ and fatty acid monoglycerides

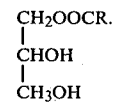

As described above, after depositing the above mentioned substance by irradiating it with the laser beam, the complex film except for the portion of deposition can be removed by washing the mask with methyl cellosolve, acetonitrile or the mixture thereof.

Turning to FIG. 3, when the white defect portion begins to be irradiated with the continuous wave (CW) laser light, the light transmitted through the white defect impinges onto a transmitted light receiver 45 after having passed through a transmitted light measuring shutter 44. The output signal from the light receiver 45 is supplied to the controller 23 to be arithmetically processed for monitoring deposition of the light shading material from the metallic complex. In the case where the white defect is illuminated with the laser light of power density of several thousand watts (w)/cm$^2$ at an area in a range from several microns ($\mu$) square to several ten microns square, deposition occurs rapidly upon elapse of the time ranging from several to several ten seconds, lowering correspondingly the quantity of light transmission. Before stopping the irradiation, an additional illumination is effected for about several seconds from the time point at which the quantity of light transmission falls to a minimum. The time point at which the quantity of light transmission becomes minimum is determined by measuring variation in the quantity of transmitted light and determining a slope of decreasing rate at which the quantity of light transmission falls steeply. The line representing the slope is extended to thereby arithmetically determine the time point at which the transmittivity is expected to become zero. This time point is assumed to be the time when the quantity of light transmission is decreased to minimum. The additional irradiation is effected for several seconds after the time point mentioned just above, which is effective to further improve the quality of the deposited shading film which exhibits a sufficient strength to withstand a scrub washing.

When the time comes to stop the irradiation, the shutter 37 for the white defect rectification is automatically closed to shut off the Ar-laser light, and the operator can confirm the remedy of the white defect by observing the TV monitor 26, which may take several seconds. Thereafter, a signal for centering the next white defect to be remedied is automatically produced by the controller 23, resulting in that the white defect in concern is caused to make appearance on the screen of the TV monitor 26 through appropriate operation of the table drive unit 27. The aforementioned procedure for remedying the white defect is repeated in the similar way. In this manner, the shading films are formed through deposition at the regions of the white defects successively. When all the white defects have been irradiated with the Ar-laser light to form the respective shading films thereon, the Ar-laser 31 is deactivated and at the same time the Ar-laser shutter 32, the Ar-laser monitor shutter 33 and the shutter 44 for the measurement of transmitted light are all closed.

The photomask 21 having all the white defects irradiated with the laser light as described above is then subjected to ultrasonic cleanings in solvents of methyl cellosolve and isopropyl alcohol for several minutes, respectively. After the photomask subsequently undergoes an after-baking (post-baking) process in an ultraviolet-ray oven, it is again disposed on the support stage or table 22, and the positioning alignment is performed in the same manner as described hereinbefore. Thereafter, the controller 23 is changed over to the Dye-laser monitor mode. The power changeover switch 29 is then turned to the switch position B, whereby the laser power supply source 46 for the N$_2$-laser excited Dye-laser is rendered operative. The Dye-laser shutter 48 and the Dye-laser monitor shutter 36 are set to the open state. Then, the operator pushes a Dye-laser monitor button, which results in that the pulse like oscillation of the Dye-laser 47 at 10 Hz is triggered. About 2% of the laser light having transmitted through the specific half-mirror 39 impinges on a laser light receiver 49 provided in association with the Dye-laser 47. The output of the receiver or optoelectrical transducer 49 is measured by the power meter 35 whose output signal is fed back to the controller 23. When the measured output is deviated from a predetermined signal level, a transmittivity variable filter 50 of angle adjustable Brewster plate type is adjusted by the signal issued from the controller 23 to thereby regulate the laser pulse output power of the Dye-laser 47 to the predetermined power level. It should be noted that 98% of the laser pulse output of the Dye-laser 47 is reflected by the special half-mirror 39 and interrupted by the shutter 37 for rectification of the white defects, which shutter 37 is now in the closed state.

Next, the controller 23 is set to the black defect remedying mode. The Dye-laser 47 stops the oscillation and remains in the standby state. The operator then pushes a black defect positioning or centering button provided on the controller 23, which results in that the table drive unit 27 is operated in accordance with defect address information or data read out from the cassette tape 40 to display on the TV monitor 26 the black defect to be first remedied. Subsequently, the black defect in concern is enclosed by the four reference lines 26a and the irradiation button is pushed in the same manner as in the case of the rectification of the white defect described hereinbefore, whereupon the white defect rectification shutter 37 is opened, being automatically followed by generation of two shots of laser pulses by the Dye-laser 47, to thereby remove the extra residue of the mask material. Thereafter, the white defect rectification shutter 37 is closed. In this manner, the duration in which the shutter 37 is opened is limited to a necessary minimum in consideration of the possibility that the laser pulse may unwantedly be emitted by noise and would otherwise injure the photomask. In succession to the closing of the shutter 37 for the white defect rectification, the operator can confirm the remedied state of the black defect for several seconds, and another black defect to be next remedied is automatically centered. The rectification or remedy of the black defect is effected in the similar manner. The remedy process is repeated until all the black defects have been rectified in the black defect remedying mode, whereupon remedied white defects are again successively centered to remove the excessively deposited shading material in the manner similar to the rectification of the black defect.

Special half mirror 39 is possible to be replaced by a movable mirror 39'. In this case the movable mirror is kept out of the main optical axis when white defects are repaired and is moved into the axis when black defects are repaired. In this case the mirror face is a simple full reflective mirror with transmittivity of 2% against the wavelength of 5100 Å.

FIG. 4 graphically illustrates a spectral transmittivity characteristic of the special half-mirror 39 employed in the system shown in FIG. 3. A point M represents the transmittivity of about 90% for the light wavelength of 488 nm, while a point N represents the transmittivity of about 2% for the wavelength of 510 nm. As will be appreciated from the foregoing, the Ar-laser light of the wavelength of 488 nm used for the remedy of the white defect has to be transmitted through the half-mirror 39 to a maximum, while the Dye-laser light of 510 nm in wavelength used for the remedy of the black defect must be reflected to a maximum. In this connection, the capability of the half-mirror 39 to withstand the laser output power must be taken into consideration, since the output power density of the Dye-laser is as high as $10^7$ w/cm$^2$. If the locations of the Ar-laser 31 and the Dye-laser 47 shown in FIG. 3 are assumed to be replaced by each other, the special half-mirror 39 will present a high reflection factor to the Ar-laser light, while presenting a high transmittivity to the Dye-laser light. In this case, the half-mirror 39 can not enjoy a long use life, because it is exposured to the high laser power output on the order of $10^7$ w/cm$^2$ for a longer period. Accordingly, the half-mirror 39 should preferably be used in the mode in which the Dye-laser output light is reflected, as described above.

FIG. 5 illustrates schematically a basic structure of the optical projection systems 42 and 43 employed in the apparatus (FIG. 3) according to the invention. Laser light beam 51 is shaped through cooperation of X-slit members 52 and Y-slit members 53 which are independently movable in the X-direction and the Y-direction, respectively, and incident on an objective lens 43 in a form of a light beam having a rectangular crosssection. Thus, the slit light image defined by the slit members 52 and 53 is projected onto a defect 56 of the photomask 21 in a reduced size through the objective lens 43 for irradiation of the defect 6. The prevailing optical conditions are illustrated in more detail in FIG. 6. The laser light 51 is shaped by the slit members 52 and 53 disposed on a first conjugate image plane 62 of the objective lens 43, whereby only the shaped light beam having passed through the slit aperture falls on the objective lens 43 and once focussed at a focal plane 67 for illuminating a second conjugate plane 68 of the objective lens 43. In other words, a slit light image 68 defined by the slit members 52 and 53 is projected onto the second conjugate plane 68 with a reduction factor n which is given by the following expression:

$$n = \frac{b}{a}, \text{ where } \frac{1}{a} + \frac{1}{b} = \frac{1}{f}$$

where a represents a distance between the first conjugate image plane 62 and a main plane 65 of the lens 43, b represents a distance between the second conjugate image plane 68 and the main plane 65 of the lens 43, and f represents the focal length of the lens 43. In the case of the illustrated embodiment of the invention, the reduction factor n is selected to be 1/100, while the conjugate distance (a+b) is 229 mm. Accordingly, displacement of the slit members (52, 53) by 10 μm is reflected as a displacement of 0.1 μm of the slit image projected onto the second conjugate image plane 68 on which the photomask 21 is disposed. This means that rectification or remedy of the defect can be accomplished at an extremely high precision.

FIG. 7A to FIG. 7C illustrate a process for remedying the white defect according to an embodiment of the invention. It will be seen that a white defect 3 is present in a Cr-mask pattern 5 deposited on a glass substrate 4. A complex material 70 is applied over the mask pattern 5 and pre-baked at a temperature of about 80° C. for several minutes to evaporate the solvent contained in the applied complex material. Thereafter, the white defect portion 3 is illuminated by the laser light 71, which is followed by ultrasonic cleaning of the chip in methyl cellosolve and isopropyl alcohol for several minutes, respectively. Then, the deposited shading films remain at only the region which has been irradiated with the laser light. In this way, the white defect 3 is repaired. Referring to FIGS. 8A to 8D which illustrate the aforementioned defect remedying process in top plan views, it will be seen that when the Cr-photomask pattern 2 suffering the white defect 3 is coated with the complex material 70 and irradiated with the laser light with the slit image 72 projected onto the white defect 3 in alignment therewith, there is produced a half-deposited portion 73 like a blot or stain in a peripheral portion of the irradiated region, as brought about by thermal conduction, diffraction of light and the like. If these half-deposited or blurred portions 73 are left as they are, they will produce a corresponding shadow upon actual use of the finished photomask to eventually degrade the pattern precision. Rectification of these half-deposited or blurred portions by the irradiation of laser light in the black defect remedying mode described hereinbefore is undesirable because of the possibility of mask portions located around the blur being injured due to high transmittivity thereof. Under the circumstances, it is proposed according to an aspect of the invention that the chip be subjected to a post-baking process at a temperature of ca. 200° C. for ca. 1 minute in an ultraviolet ray furnace. Then, the shading action of all the deposited regions inclusive of the half-deposited portion are further enhanced with the deposition of the half-deposited portion being promoted to be much stabilized, while the absorption of laser energy by these half-deposited portion is also increased. Subsequently, the deposited portions 74b protruding from the normal pattern and transformed from the half-deposited portion 73 by the post-baking can be readily removed together with the inherently excessive deposited portions 74a through the common black defect remedying operation described hereinbefore. In this way, the light shading property of the remedied white defect portion can be improved by the post-baking with the half-deposited portion being further deposited to be much stabilized, whereby they can be removed together with the excessively deposited portions, to advantages. Further, comparison of the mask undergone the pre-baking with those not pre-baked shows that the former exhibits an increased capability of withstanding the scrub washing as compared with the latter.

FIG. 9 graphically illustrates a method of setting a time interval for the additional laser light irradiation required in the white defect remedying process described hereinbefore. At a time point 0 at which the irradiation with the laser light is initiated, the transmittivity of the applied complex material is smaller than that of the glass substrate only by several percents, as indicated by a point 81. Deposition of the shading material begins after a time lapse of several seconds to several ten seconds, as indicated by a point 82, which is immediately followed by a rapid deposition with the shading effect being correspondingly enhanced, while the transmittivity being concurrently decreased. In the period in which the rapid deposition occurs, the time points A, B, C and D which correspond to the transmittivities of 80%, 60% 40% and 20%, respectively, are determined. Through a linear approximation of the transmittivities at the time point A, B, C and D, a time point E at which the transmittivity is expected to become zero is arithmetically estimated. The additional or supplementary irradiation with laser light is effected for several seconds from the time point E and the irradiation is stopped at a time point F. Such additional or suplementary irradiation with the CW laser light is advantageous in that deposition of the half-deposited portions is further promoted to increase the shading property of the applied film, the bonding of the film to the glass substrate is enhanced, and that the capability of the photomask to withstand the scrubbing action in the scrub washing of the mask is improved. However, an excessively long additional irradiation will be accompanied by a danger of the completely deposited shading film being injured while the transmittivity thereof being decreased to degrade the shading property. If a pulsed laser is applied instead of CW laser, the change of transmittivity is so fast that it is not only difficult to get the film in best quality but sometimes laser pulses damage the film.

FIG. 10 illustrates the summarization of the photomask redressing process according to the invention. A photomask which has been checked with respect to the locations or addresses at which the defects are present is coated with a complex material containing Ag and Ti in a thickness ranging from 0.2 to 2.0 μm and pre-baked at a temprature in a range of 60° C. to 100° C. for several minutes in an electric oven. The ultraviolet ray oven can not be used to this end because of the possibility of deposition unwantedly occurring at this time point. After the pre-baking process, the photomask assembly is placed in the mask redressing apparatus, whereby the white defects are irradiated with the laser light to thereby form the light shading film through deposition.

The photomask assembly thus prepared is then subjected to an ultrasonic cleaning for about ten minutes in methyl cellosolve to remove undeposited portions. Next, the ultrasonic cleaning of the photomask is again carried out in isopropyl alcohol for about five minutes to drive off methyl cellosolve. Subsequently, the mask assembly is baked in an ultraviolet ray oven at a temperature in a range from 150° C. to 300° C. for a period of 30 seconds to 5 minutes. Through this post-baking process, deposition of the half-deposited fringe portions is promoted to decrease the transmittivity while enhancing the light shading property. Further, the bonding strength of the light shading film to the glass substrate is also increased. It should however be mentioned that excessively high temperature as well as excessively long duration of the post-baking process give rise to deterioration of the film characteristics and the light shading property.

After the post-baking process, the mask is placed in the redressing apparatus in which the inherent black defects as well as the extra deposited portions 74b formed at the remedied white defect portions and protruding from the normal pattern and the excessively deposited portions 74a are remedied in the manner already described in detail. The photomask thus redressed is taken out from the apparatus and subjected to the scrub washing. The processing has now been completed.

In the foregoing description of the exemplary embodiments of the invention, it has been mentioned that an $N_2$-laser excited Dye-laser is employed as the pulse laser while an Ar-laser is used as the continuous wave laser. However, the invention is never restricted to the use of such laser. Other combinations of lasers capable of emitting the pulse-like laser beam and the continuous wave laser rays may equally be employed. However, the lasers are restricted with respect to the wavelength which should fall within the range from near-ultraviolet to near-infrared radiations (e.g. from 0.35 to 1.2 μm) so that the lasers be compatible with the refraction optical system according to the invention.

Further, it goes without saying that the two laser devices can be replaced by a single laser device which is capable of producing selectively the continuous wave output and the pulse output, such as a CW-YAG laser provided with an ultrasonic QSW, an Ar-laser combined with a cavity damping ultrasonic cell or the like, for example.

It will now be appreciated that the present invention which teaches that the white defect remedying function be incorporated in the hitherto known mask redressing apparatus originally destined for remedying the black defects by making use of the deposition of complex materials makes it possible to remedy not only the black defects but also the white defects as well as the deposited portions produced in the course of remedying the white defects and deviating from the normal patterns by using a single optical irradiation system in combination with the two types of lasers with a much decreased number of processing steps and significantly reduced processing time in a very facilitated manner.

It is here to be mentioned that the entire surface on the pattern side of the photomask is coated with a transparent film (not shown).

The transparent film should exhibit a high resistivity against scrubbing and washing in chemical so that the deposition film and the pattern may be protected in the washing process. Here, the transparent film is defined as a material having a high transmittivity for visible rays and ultraviolet rays when it is formed into a film, and this film can be realized by metal oxide such as silicon oxide ($SiO_2$), tantalum oxide ($Ta_2O_5$), niobium oxide ($Nb_2O_5$), and tin oxide ($SnO_2$) Among those, silicon oxide has particularly satisfactory resistivity against various chemicals. The reason why the transparent film must have a high transmittivity for visible and ultraviolet rays is that ultraviolet rays or visible rays having a short wavelength is used as the exposure light source for transferring the mask pattern onto the wafer and the like, and it would be difficult to transfer the pattern precisely if the transparent film has a low transmittivity for these rays.

The method of forming the transparent film includes: sputtering method, ion plating method, the method of spraying, soaking or rotary application of a metallic complex solution made of an organic solvent added by $Ta(OC_2H_5)$ or $Nb(OC_2H_5)$, acetylacetone and the additive onto the entire surface of the pattern, then heating the substrate to form a metal oxide film, and the method of applying a solution made of ethanol added by silicon hydroxide onto the entire surface of the pattern and heating the substrate to form a silicon oxide film.

We claim:

1. A method of correcting defects on a photomask comprising the steps of:
    (a) coating at least a transparent defect portion and its periphery on the photomask having a transparent defect portion with a film of a metal-organo complex solution;
    (b) pre-baking the coated portion of the photomask in a heat wave oven to form a film of the metal-organo complex;
    (c) altering a portion of the metal-organo complex film corresponding to said transparent defect portion to an opaque and insoluble material by exposing said portion of metal-organo complex film to a laser beam having a visible ray or ultraviolet ray in a slit-like image until said portion of metal-organo complex film is altered into the opaque condition;

(d) removing a non-altered portion of said metal-organo complex film from the photomask by washing said photomask in a solvent;

(e) after-baking said photomask in an ultraviolet ray oven to thereby cause a half-altered portion formed in a peripheral fringe of the transparent defect portion to be altered into the opaque condition; and (f) removing the altered portion which deviates from a desired circuit pattern and remaining defects originally present in said photomask through irradiation with a pulse-like laser beam projected in a slit-like light image.

2. A method of correcting defects on a photomask according to claim 1, wherein said metal-organo complex solution is made of an organic solvent added by at least silver nitrate and a carboxylic acid.

3. A method of correcting defects on a photomask according to claim 1, wherein said metal-organo complex solution is made of an organic solvent added by at least silver nitrate, a carboxylic acid and a titanium alcoholate.

4. A method of correcting defects on a photomask according to claim 3, wherein said film coated over said photomask has a thickness in a range from 0.2 to 2.0 μm, said pre-baking is effected at a temperature in a range from 60° C. to 100° C. for a time ranging from 2 to 10 minutes, and an after-baking of the photomask is carried out at a temperature in a range from 150° C. to 300° C. for a time ranging from 30 seconds to 5 minutes.

5. A method of correcting defects on a photomask according to claim 1, wherein the laser beam for exposing said transparent defect is produced by a continuous wave laser and has a power density of a range from $10^3$ to $4 \times 10^3$ w/cm$^2$.

6. A method of correcting defects on a photomask according to claim 5, wherein said laser beam is constituted by an Ar-laser.

7. A method of correcting defects on a photomask according to claim 1, wherein a pulse-like laser beam is constituted by a Dye-laser beam excited by a $N_2$-laser.

8. A method of correcting defects on a photomask according to claim 7, wherein the wavelength of said Dye-laser beam is distanced from 488 nm at least by 20 nm.

9. A method of correcting defects on a photomask according to claim 3, wherein said carboxylic acid is 0.5–5 m moles, said titanium alcoholate is 0.5–5 m moles, and said organic solvent is 2.3–48 m moles corresponding to said silver nitrate being 1.0 m mole.

10. A method of correcting defects on a photomask according to claim 5, wherein said altering step and removing step are performed by using the same laser-working device.

11. A method of correcting defects on a photomask comprising the steps of:

(a) coating a photomask having a white defect portion with a film of a metal-organo complex solution that covers at least the white defect portion;

(b) pre-baking the coated photomask in a heat wave oven to remove solvent and to form a metal-organo complex film;

(c) exposing a portion of the metal-organo complex film overlying a white defect portion and a portion of the photomask surrounding said white defect portion to a laser beam in a slit-like light image to deposit said portions of the metal-organo complex film as an opaque light-shading film, a half-deposited portion of said film also being formed in an area surrounding the periphery of said light-shading film;

(d) removing a non-deposited portion of said metal-organo complex film which has not been exposed to said laser beam from the photomask by washing said photomask in a solvent;

(e) after-baking said photomask in an ultraviolet ray oven to thereby cause the half-deposited portion of the metal-organo complex film formed in the peripheral area surrounding the light-shading film to be deposited as an opaque and insoluble material; and (f) removing a portion of the deposited film which deviates from a desired circuit pattern through irradiation with a pulse-like laser beam projected in a slit-like light image.

12. A method of correcting defects on a photomask according to claim 11, wherein said film coated over said photomask has a thickness in a range of from 0.2 to 2.0 μm, said pre-baking is effected at a temperature in a range of from 60° C. to 100° C. for a time ranging from 2 to 10 minutes and the after-baking of the photomask is carried out at a temperature in a range of from 150° C. to 300° C. for a time ranging from 30 seconds to a 5 minutes.

13. A method of correcting defects on a photomask according to claim 11, wherein said metal-organo complex solution contains an organic solvent, silver nitrate and a carboxylic acid.

14. A method of correcting defects on a photomask according to claim 11, wherein said metal-organo complex solution contains an organic solvent, silver nitrate, a carboxylic acid and a titanium alcoholate.

15. A method of correcting defects on a photomask according to claim 11, wherein said photomask has a black defect originally present in said photomask prior to step (a) and said black defect is also removed during step (f) through irradiation with said pulse-like laser beam.

16. A method of correcting defects on a photomask according to claim 14, wherein said metal-organo complex solution contains 0.5 to 5 m moles of said carboxylic acid, 0.5 to 5 m moles of said titanium alcoholate, 2.3 to 48 m moles of the organic solvent and 1.0 m mole of silver nitrate.

* * * * *